Figure 1:
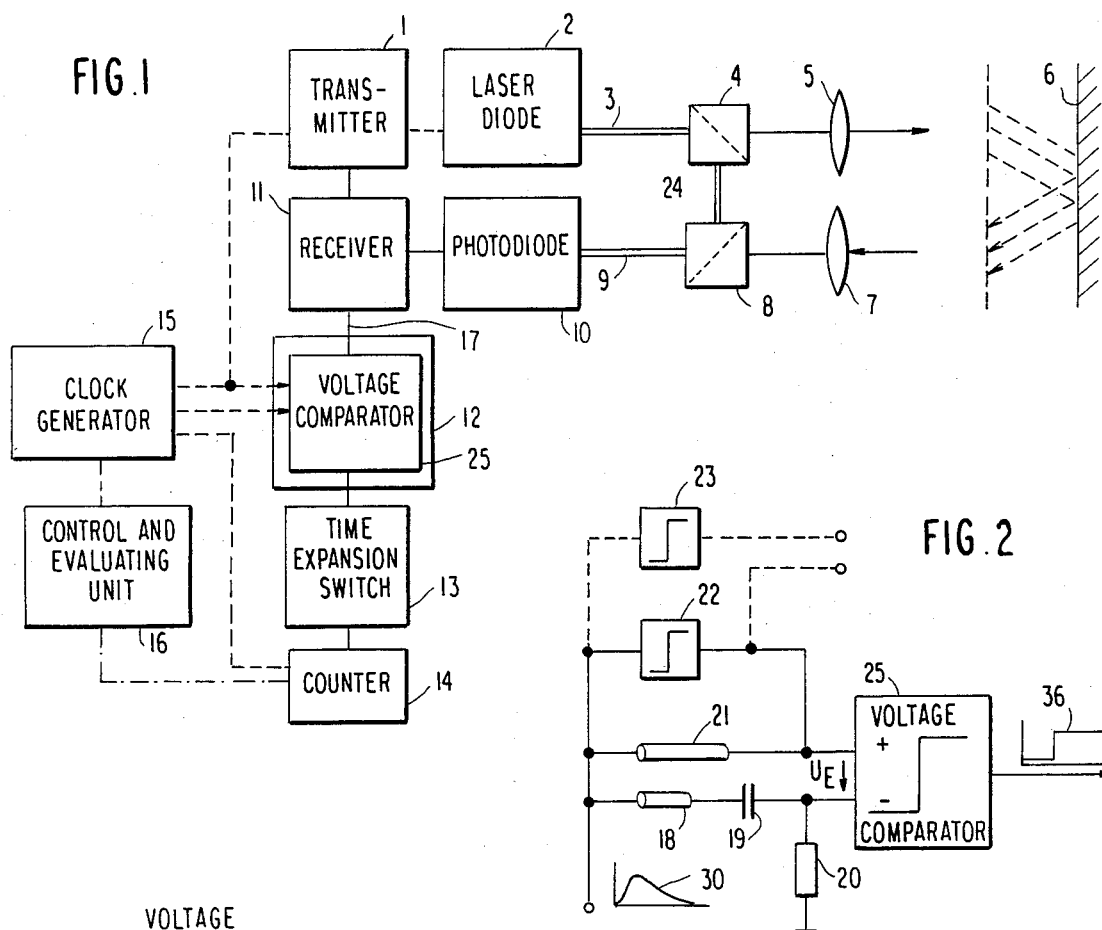

United States Patent [19]

Schwarte

[11] Patent Number: 4,734,587
[45] Date of Patent: Mar. 29, 1988

[54] OPTOELECTRIC DISTANCE MEASURING APPARATUS WITH A TIME DISCRIMINATOR FOR THE ACCURATE DETECTION OF ELECTRIC PULSE SEQUENCE

[76] Inventor: Rudolf Schwarte, Kreuztaler Strasse 56, D-5902 Netphen-Dreistiefenbach, Fed. Rep. of Germany

[21] Appl. No.: 827,306
[22] PCT Filed: May 23, 1985
[86] PCT No.: PCT/EP85/00236
§ 371 Date: Jan. 22, 1986
§ 102(e) Date: Jan. 22, 1986
[87] PCT Pub. No.: WO85/05456
PCT Pub. Date: Dec. 5, 1985

[30] Foreign Application Priority Data

May 23, 1984 [DE] Fed. Rep. of Germany ....... 3419117

[51] Int. Cl.⁴ ............................................. G01N 21/86
[52] U.S. Cl. ....................................... 250/560; 356/5
[58] Field of Search ................. 250/206, 214 R, 560, 250/561; 356/4, 5; 330/9

[56] References Cited

U.S. PATENT DOCUMENTS 4,181,431  1/1980  Chaborski ................................ 356/5
4,297,642 10/1981  Baldwin et al. ......................... 330/9
4,521,107  6/1985  Chaborski et al. ..................... 356/5
4,553,836 11/1985  Meirer et al. ........................... 356/5

OTHER PUBLICATIONS

"A Leading-Edge Time Pickoff Circuit", *Nuclear Instruments and Methods*, No. 67, North-Holland Publishing Co., 1969, by S. Kinbara et al., pp. 261-266.

Primary Examiner—David C. Nelms
Attorney, Agent, or Firm—Young & Thompson

[57] ABSTRACT

An optoelectric distance measuring apparatus, wherein short light pulses emitted by a laser diode and reflected by the target object are received by a photodiode, is associated with a time discriminator (12) for the processing of the electric signals, this time discriminator controlling the gate time of a clock generator, the clock pulses of which are gated through to a counter. To provide for a more exact determination of the chronological sequence of electric signals having varying amplitudes, a minimum comparator (22) is connected to the electric pulse source (17), this minimum comparator regulating the offset voltage via an offset circuit in such a way that this voltage is applied at the correct instant to the positive input of a voltage comparator (25) and that, directly thereafter, derivation of the determining point in time takes place from the differentiated signal and from the original signal.

4 Claims, 3 Drawing Figures

OPTOELECTRIC DISTANCE MEASURING APPARATUS WITH A TIME DISCRIMINATOR FOR THE ACCURATE DETECTION OF ELECTRIC PULSE SEQUENCE

The invention relates to an optoelectric distance measuring apparatus wherein short light pulses emitted by a light source such as a laser diode, and reflected by a target object are received by a photodiode, respectively one optical switch being arranged in an optical transmitting guide as well as receiving guide for the formation of a short path for reference signals, and wherein the electric pulse signals provided by the photodiode are fed to a time discriminator controlling the gate time of a quartz oscillator, the clock pulses of the latter being gated to a counter, this time discriminator being connected to an offset voltage; a differentiating member is connected in front of the negative pulse input, and a delay line is connected in front of the positive pulse input of this discriminator.

In a conventional optoelectric rangefinder as described, for example, in the EP Publication No. 0076232, a determination is made, on the one hand, of the transit time of the light pulses (target pulses) emitted by the laser diode, reflected by a target object, and received by the photodiode and, on the other hand, of the transit time of the reference pulses emitted by the laser diode but passing by way of the optical switches and the short path to the photodiode, and evaluated for range-finding. In this process, the first-arriving reference pulse triggers, after an optoelectric transformation in a time discriminator, a gate time signal which is cut off by the later-arriving target pulse passing via the target object. During the controlled gating time, the clock pulses (150 MHz) continuously generated by a quartz oscillator are gated through a counter. The counted pulses are fed in groups to a processor determining, by sorting and mean value formation, the distance to be detected. In order to elmininate errors caused by fluctuations in the supply voltage and in the temperature, an addition value is formed for the time discriminator with the use of auxiliary pulses. This measuring procedure permits only the counting out of whole meter steps in various threshold value ranges and makes possible the measurement on the order of magntiude of centimeters and millimeters only with the aid of a disadvantageous mean value formation from a plurality of individual measurements. Although DOS No. 2,908,854 also discloses a device having an accuracy lying in the millimeter range, this can be done only by means of the sampling method utilized for transforming the pulses into the LF range wherein the curve shape is reconstructed from many scanned amplitude samples; this is effected in a very complicated way and furthermore merely in a very narrow measuring range since the time transformation can be performed only during the so-called rapid sawtooth voltage.

In cases where a time discriminator is used in distance measuring devices of this type for the processing of the electric pulse signals, there is the disadvantage that an exact determination of their time sequence is greatly impaired by varying amplitudes; in other words, a change in amplitude causes a corresponding shift in time of triggering the derived signal. The problem in connection with time discriminators resides in the identification of signals of varying amplitudes with respect to their exact location in time. The rising flank is to be maximally short in order to fix this time determination very exactly. The errors of the conventional cicuits are due, above all, to the fact that, on account of the finite rising time, the time discriminators employed respond with differing delays. In order to compensate for this effect, the conventional circuits utilize a so-called constant-fraction trigger using, for identification of the point in time, a signal predominantly a differentiated signal, derived from the signal proper. For this purpose, for example, a differentiated pulse is applied to the negative input of a voltage comparator, and the pulse proper is applied to the positive input. The negative voltage at the input of the voltage comparator can be created, for example, by an RC member. The circuits of a conventional type operate with a constant offset voltage, and the voltage comparator responds only when this offset voltage has been exceeded. This offset voltage lies practically on the order of several millivolts and cannot be reduced any further because otherwise the voltage comparator would switch spontaneously due to interfering signals, noise, etc.

In contrast thereto, the invention is based on the object of providing, in a distance measuring apparatus of the type discussed hereinabove, an improved signal processing by means of a time discriminator, which latter is also generally suitable for the exact determination of the time sequence of electric pulses of differing amplitudes.

This object has been attained, according to the invention, by a minimum comparator connected directly to the electric pulse source and controlling the offset voltage of a voltage comparator, and by respectively one delay line connected in front of the positive and negative inputs of the voltage comparator.

By this circuit arrangement, the advantage is attained that a suitable offset voltage is applied at the correct instant to the input of the voltage comparator. The novel circuit operates likewise with an offset voltage, but the latter is modified with respect to the pulse at the moment the determining time is derived from the differentiated pulse signal and the original pulse signal in such a way that a minimum of time shift results with amplitudes differing from one another. While heretofore an actually desirable positive offset voltage could not be utilized on account of the unstable switching characteristic, the invention provides switchover to a positive offset voltage at the correct point in time. For this purpose, the pulse signal to be determined is first applied to the minimum comparator which triggers offset switchover. Respectively one delay line is associated with the positive input and the negative input of the voltage comparator so that, upon arrival of the differentiated pulse signal and the orginal pulse signal, there is already present a modified offset voltage at the voltage comparator. In this connection, the delay provided in the positive input is designed to be longer in order to obtain a maximally fast voltage change at the input of the voltage comparator by overlapping of the rapid rise of the direct pulse and of the rapid drop of the differentiated pulse. Coaxial conductors can be utilized, for example, for delay means.

Although the novel circuit for a time discriminator is especially suitable for an optoelectric distance measuring apparatus, it can just as readily be utilized also in general for a time discriminator in order to accurately detect the time sequence of electric pulses of varying amplitudes.

A maximum comparator can be connected in parallel with the minimum comparator so that the amplitude values which fall short of or exceed, respectively, the lower or upper limit value can be determined and applied, for example for the purpose of elimination, to a control and evaluating unit.

The extremely time-accurate rectangle pulses leaving the time descriminator permit sweep magnification by connecting the output of the voltage comparator to the counter via a time expansion switch. Thus, the gate time can be dilated, for example, by a factor of 500 or 1000, and counting can take place in a counting rhythm of, for example, 50 MHz; the error in time quantization would be maximally 20 ps with a clock cycle of 20 ns and a time expansion factor of 1000. Accordingly, exact distance measurements can be performed up into the millimeter range.

Figure 2:
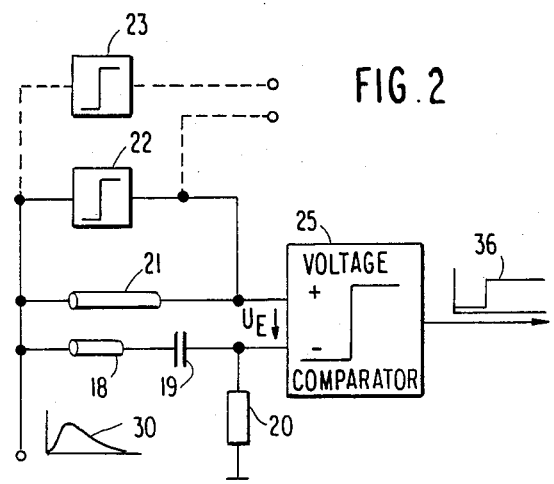
Figure 3:
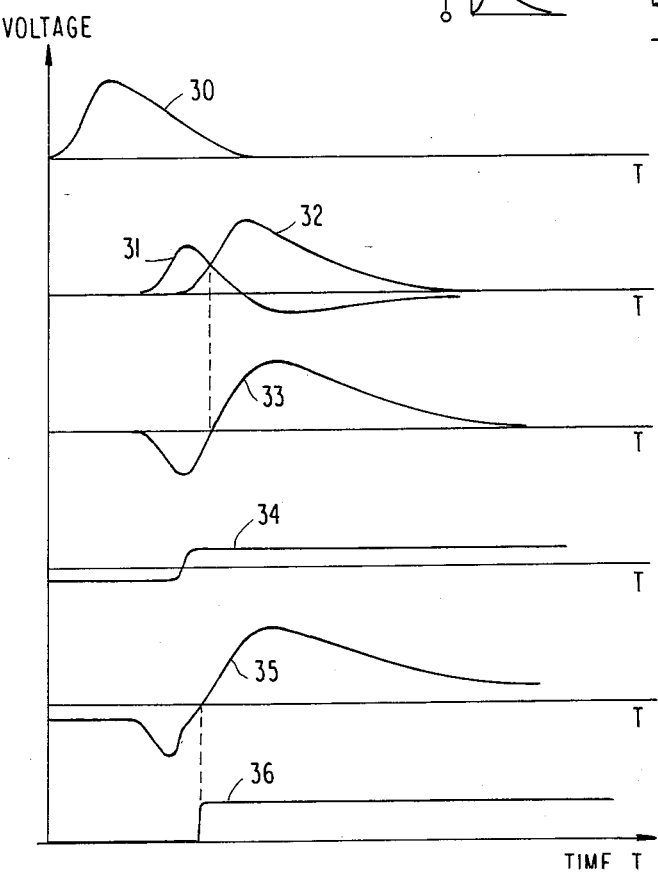

The invention is illustrated in the drawings by way of example wherein:

FIG. 1 is a block circuit diagram of an optoelectric distance measuring apparatus, FIG. 2 shows the circuit diagram of a time discriminator, and FIG. 3 shows the most relevant input voltages of the time discriminator in a voltage-time diagram.

The optoelectric distance measuring apparatus continuously generates short light pulses by means of a transmitter 1 and a laser diode 2, these pulses being directed via a lightguide 3 and a transmitter optic 5 onto a target object 6. The reflected light pulses pass via a receiver optic 7 and a lightguide 9 into a photodiode 10 which latter transforms the thus-received light signals into electric pulses. In the lightguide 9 on the transmitter side, respectively one optical switch 4 and 8 is arranged, both of these switches being connected by a lightguide 24. By means of the light gate 4 on the transmitter side, a part of the light energy, about 1%, is branched off from the optical transmitter channel into the lightguide 24 and conducted through the light gate 8 on the receiver side into the optical receiving channel. This derived light signal, introduced into the receiving channel via the short path, forms a reference signal received by the photodiode chronologically before the light signal (target signal) reflected by the target object, namely by the time required by the light pulse for traveling to and fro between the apparatus and the target object. The transmit time of the target pulse, and thus the distance between the transmitting and receiving optics 5, 7, respectively, and the target object 6, can be determined from the target signal and the reference signal.

The received light signals, namely the reference and target signals, are transformed by means of the photodiode 10 into electric pulses or signals, and the latter are conducted via a receiver 11 to a voltage comparator 25. The voltage comparator 25 forms gating pulses (rectangular pulses) for a counter 14 to which are gated, within the gate time, the clock pulses from a clock generator 15 (quartz oscillator). In order to increase time resolution, the gating pulses are transmitted via a time expansion switch 13 to which can be assigned, for example, a sweep magnification factor of 500, 1000, or the like. This sweep magnification permits an exact counting of clock pulses, the frequency of which can lie, for example, on the order of magnitude of 50 MHz.

The thus-counted clock pulses corresponding to the gate time are supplied to a control and evaluating unit 16 for evaluation. The clock generator 15 furthermore activates the transmitter 1 and the receiver 11. Also, the voltage comparator 25 is controlled by a time window selecting the processing of the reference signal or of the target signal; in this connection, it is possible, for example, to process in succession only reference signals or only target signals in order to form groups from these, the groups permitting evaluation by sorting and mean value formation or the like.

The electric pulse source constituted by the receiver 11 is denoted by 17. As shown in FIG. 2, the negative input of the voltage compartor 25 is connected to the electric pulse source 17 by way of a delay line 18 and a differentiating member, in this case consisting, for example, of a capacitor 19 and a resistor 20, whereas the positive input is connected by way of a delay line 21.

The two delay lines 18, 21 are initially both designed in order to compensate for the actual delay time of the minimum comparator 22 and for an appropriate signal delay in order to apply an offset voltage pulse from 22 to the positive input 26 of the voltage comparator 25 during that time range when the comparator input voltage $U_E = U_+ - U_-$ passes its minimum voltage as shown in FIG. 3 by means of the voltages 33 and 34. Additionally, in delay line 21, the delay is designed so that the steepest regions of the rising flank of the direct pulse and of the falling edge of the pseudo-differentiated pulse overlap in time at the input of the voltage comparator 25. This offset voltage is regulated by a minimum comparator 22, which latter is directly connected to the electric pulse source 17. The minimum comparator 22 herein controls an offset circuit (not shown) which applies the offset voltage.

Typical time discrimination of the electric pulse source 17 with nanosecond rise times requires delay times of e.g. 5 nanoseconds for delay line 21 and e.g. 3 nanoseconds for delay line 18. Pseudo-differentiation of the pulse at 17 by means of the high pass is attained with a capacitor 19 of 50 picofarad and a resistance 20 at 50 Ohms, for example.

FIG. 3 gives an example of the most relevant voltages and time relations of the time discriminator according to the invention. Voltage 30 indicates the voltage of the electric pulse source 17, the leading edge of which is to be time discriminated. Voltage 31 is derived from 30 by delaying by means of the delay line 18 and by pseudo-differentiating by means of the resistor 20 - capacitor 19 - high pass. It describes the voltage of the negative input 27 of the voltage comparator 25. Voltage 32 is a replica of voltage 30, only delayed by delay line 21. Voltage 32 is the voltage of the positive input 26 if there is no offset pulse superimposed by means of the minimum comparator 22. Voltage 33 is the differential input voltage of the voltage comparator 25 without any offset pulse due to the minimum comparator 22, i.e. voltage 33 = voltage 32 minus voltage 31. Voltage 34 indicates the offset pulse caused by the minimum comparator 22 at the positive input 26. Voltage 35 indicates the differential input voltage $U_E$ of the voltage comparator including the effect of offset switching, i.e. superposition of voltage 33 and voltage 34. As a result of the zero crossing of voltage 35 the voltage comparator 25 is triggered. Voltage 36 indicates the idealized output voltage of the voltage comparator 25. Auxiliary circuits for resetting the voltage comparator 25 are omitted.

It is clarified in FIG. 3 that the offset is modified with respect to the pulse, at the instant at which the determining time is derived from the differentiated signal 31 and the unmodified signal 32, in such a way that with changed amplitudes there is a minimum of time shift.

FIG. 2 furthermore shows that a maximum comparator 23 is connected, at its input end, in parallel with the minimum comparator 22. The amplitude values detected by the minimum comparator 22 and the maximum comparator 23 which fall short of or exceed, respectively, the lower or upper limit values can be fed, for example for elimination purposes, to the correspondingly designed control and evaluating unit 16.

I claim:

1. In an optoelectric distance measuring apparatus comprising means for emitting light pulses; means for receiving said emitted light pulses; means directing a first portion of said emitted light pulses toward a target for reflection by said target and thereafter for reception by said light receiving means, and a second portion of said emitted light pulses directly into said light receiving means; a photodiode disposed downstream of said light receiving means, for converting said received light pulses to electric pulse signals; a primary comparator receiving said electric pulse signals emitted by said photodiode, said primary comparator having a positive and a negative pulse input; means for generating clock pulses, having a gate time controlled by said primary comparator; a counter to which said generated clock pulses are gated; said primary comparator being adapted to be connected to a source of offset voltage; a differentiating circuit connected between said photodiode and said negative pulse input of said primary comparator; and a delay line connected between said photodiode and said positive pulse input of said primary comparator; the improvement in which a minimum comparator is connected between said photodiode and said positive input of said primary comparator, said minimum comparator being adapted to regulate offset voltage from a said source thereof; and additional delay lines are respectively connected to said positive and negative pulse inputs of said comparator.

2. Optoelectric distance measuring apparatus according to claim 1, wherein a maximum comparator (23) is connected, at its input end, in parallel with the minimum comparator (22).

3. Optoelectric distance measuring apparatus according to claim 1 or 2, characterized in that the output of the voltage comparator (25) is connected to the counter (14) via a time expansion switch (13).

4. In a time discriminator for the exact detection of the time sequence of electric pulses having varying amplitudes, said discriminator being connectable to a source of offset voltage, said discriminator comprising positive and negative pulse inputs, a differentiating member connected to said negative pulse input of said discriminator, and a delay line connected to said positive pulse input of said discriminator, the improvement comprising a minimum comparator (22) directly connectable to an electric pulse source (17) and adapted to regulate offset voltage supplied to said discriminator by a said source thereof; and first and second delay lines (18, 21) connected respectively to said positive and negative inputs of said discriminator.

* * * * *